United States Patent
Benveniste et al.

(10) Patent No.: US 7,579,602 B2
(45) Date of Patent: Aug. 25, 2009

(54) ION IMPLANTATION WITH A COLLIMATOR MAGNET AND A NEUTRAL FILTER MAGNET

(75) Inventors: Victor M. Benveniste, Lyle, WA (US); Christopher W. Campbell, Newburyport, MA (US); Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 339 days.

(21) Appl. No.: 11/615,317

(22) Filed: Dec. 22, 2006

(65) Prior Publication Data

US 2008/0149845 A1    Jun. 26, 2008

(51) Int. Cl.
*H01J 37/147* (2006.01)
*H01J 37/317* (2006.01)
*H01J 1/50* (2006.01)

(52) U.S. Cl. .................. 250/396 ML; 250/492.21; 250/492.3; 250/396 R; 335/210

(58) Field of Classification Search .......... 250/396 ML, 250/492.21, 492.3, 396 R; 335/210
See application file for complete search history.

(56) References Cited

U.S. PATENT DOCUMENTS

| | | | |
|---|---|---|---|
| 5,438,203 A | | 8/1995 | Glavish et al. |
| 5,481,116 A * | | 1/1996 | Glavish et al. ......... 250/396 ML |
| 6,489,622 B1 * | | 12/2002 | Chen et al. ............. 250/492.21 |
| 6,998,625 B1 * | | 2/2006 | McKenna et al. ...... 250/492.21 |
| 2003/0200930 A1 | | 10/2003 | Chen et al. |
| 2004/0002202 A1 * | | 1/2004 | Horsky et al. ............... 438/515 |
| 2006/0022149 A1 | | 2/2006 | Rouh et al. |

FOREIGN PATENT DOCUMENTS

EP    0473097 A2    3/1992

OTHER PUBLICATIONS

SHX, SEN Corporation, Jun. 2005, web site: www.senova.co.jp/english/product/hicurre/shx.html.
Kikuchi et al., "Profile and Angle Measurement System of SHX", SEN Corporation, 2006, pp. 393-396, American Institute of Physics, Japan.

* cited by examiner

Primary Examiner—Nikita Wells

(57) ABSTRACT

This disclosure describes an ion implanter having a collimator magnet that is configured to shape an ion beam. A first deceleration stage is configured to manipulate energy of the ion beam shaped by the collimator magnet. A neutral filter magnet is configured to filter neutral atoms from the ion beam passing through the first deceleration stage.

14 Claims, 2 Drawing Sheets

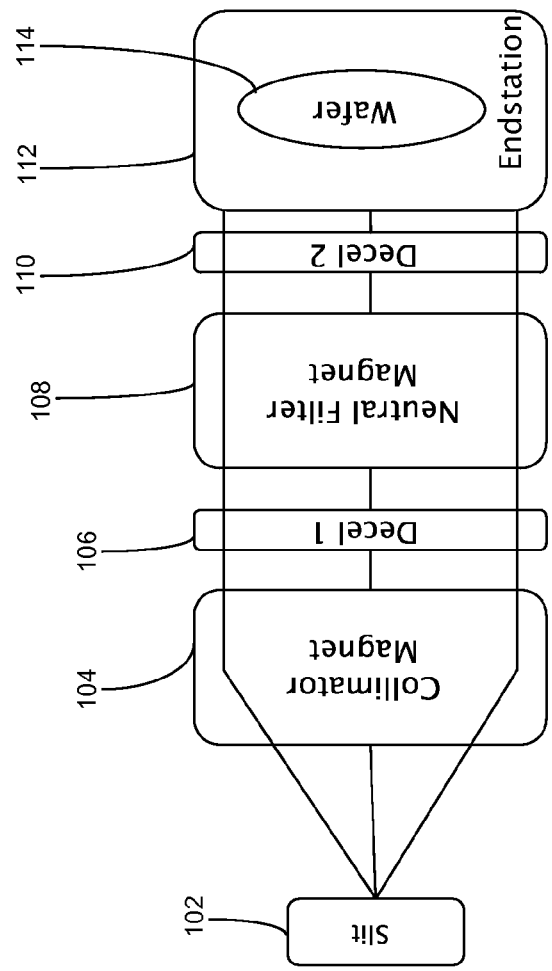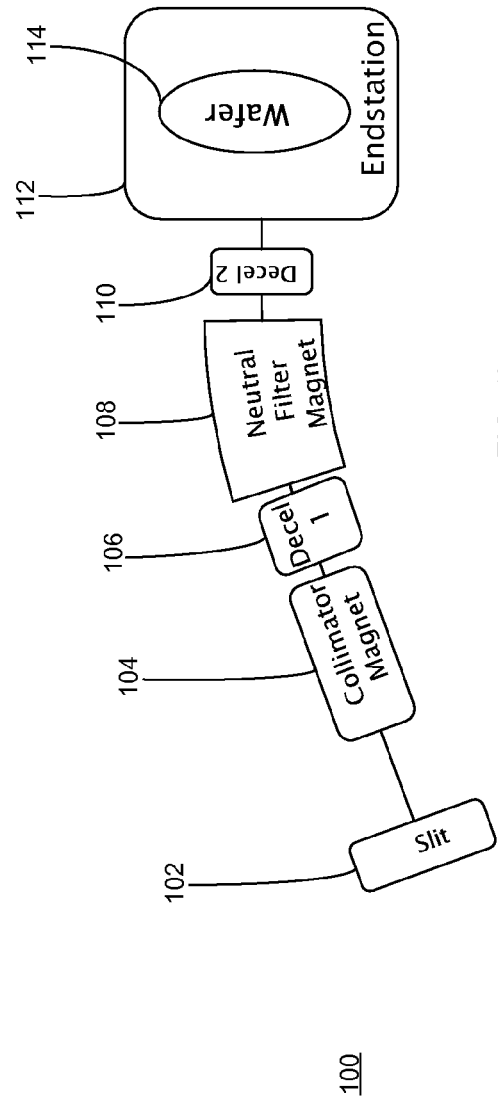

ION IMPLANTATION WITH A COLLIMATOR MAGNET AND A NEUTRAL FILTER MAGNET

BACKGROUND

This disclosure relates generally to an ion implanter, and more specifically to using a collimator magnet and a neutral filter magnet in combination with deceleration stages to improve the performance of an ion implanter.

Ion implantation is a standard technique for introducing conductivity-altering impurities into workpieces such as semiconductor wafers. In a conventional beamline ion implanter, such as a high current ion implanter, an ion source generates an ion beam and extraction electrodes extract the beam from the source. An analyzer magnet receives the ion beam after extraction and filters selected ion species from the beam. The ion beam passing through the analyzer magnet then enters a first deceleration stage comprising multiple electrodes with defined apertures that allow the ion beam to pass through. By applying different combinations of voltage potentials to the multiple electrodes, the first deceleration stage can manipulate ion energies. A corrector magnet shapes the ion beam generated from the first deceleration stage into the correct form for deposition onto the wafer. In particular, the corrector magnet receives a divergent ion beam and collimates the beam. In addition, the corrector magnet filters out any ions from the beam that may have been neutralized while traveling through the beamline. A second deceleration stage comprising a deceleration lens receives the ion beam from the corrector magnet and further manipulates the energy of the ion beam before it hits the wafer. As the beam hits the wafer, the ions in the beam penetrate the surface of the wafer coming to rest beneath the surface to form a region of desired conductivity, whose depth is determined by the energy of the ions.

As devices shrink, following Moore's Law, the required junction depths are continuously getting shallower and the required energy is being reduced. This presents a particular challenge to modern ion implanter design as low energy beams, particularly high current ones, are very difficult to transport without significant loss of beam current. There are generally three parameters that semiconductor manufacturers try to control in order to maintain good throughput and tight process control in high current ion implanters—beam current, energy contamination and uniformity both of ion beam current density and angle of implantation. If the beam current is low, this will reduce the throughput of the implanter for a given total dose. A reduction in throughput will result in extra costs for a semiconductor manufacturer because more time and money is needed to perform additional implantations to account for the reduction in throughput. Energy contamination occurs when there is a small fraction of the ion beam that is at a higher energy than desired. This small fraction of the ion beam will rapidly increase the depth of the p-n junction that is formed when creating an integrated circuit and lead to degraded performance of the electronic circuit. If the ion beam current density and angle of implantation are not uniform, there will be varying device properties across the face of the wafer. Varying device properties can compromise the yield or cause the semiconductor manufacturer to work harder at other process steps to open the yield window to take into account the variations in the implant step.

High current ion implanters typically have the capability to allow semiconductor manufacturers to individually control beam current, energy contamination and uniformity of both ion beam current density and angle of implantation, or at best, address any two out of the three parameters. Currently available high current ion implanters are unable to take into account all three of the parameters at one time. For example, a semiconductor manufacturer could perform an ion implantation with high beam current and low energy contamination, but this implantation would generally suffer a significant loss of uniformity of both ion beam current density and angle of implantation; the yield impact makes this an unattractive choice. Likewise, an ion implantation that is able to address beam current and uniformity, would likely suffer energy contamination problems. This choice is selected by some device manufacturers because some devices can be designed to allow energy contamination. Finally, an ion implant process that has both good uniformity and low energy contamination typically only produces low beam current and thus low throughput; this choice is selected by many device manufacturers. None of these approaches can control beam current, energy contamination and uniformity of ion beam current density and angle of implantation in one implantation without making any sacrifices in any of the three parameters.

SUMMARY

In one embodiment, there is an ion implanter that comprises a collimator magnet that is configured to shape an ion beam. A first deceleration stage is configured to manipulate energy of the ion beam shaped by the collimator magnet. A neutral filter magnet is configured to filter neutral atoms from the ion beam passing through the first deceleration stage.

In a second embodiment, there is a method of ion implantation. In this embodiment, the method comprises generating an ion beam; shaping the ion beam into a parallel ribbon beam; manipulating energy of the shaped ion beam; and filtering neutral atoms from the ion beam.

BRIEF DESCRIPTION OF THE DRAWINGS

FIGS. 1a-1b show a schematic top view and elevational view, respectively, of an ion implanter according to one embodiment of the disclosure.

DETAILED DESCRIPTION

Figure 2:
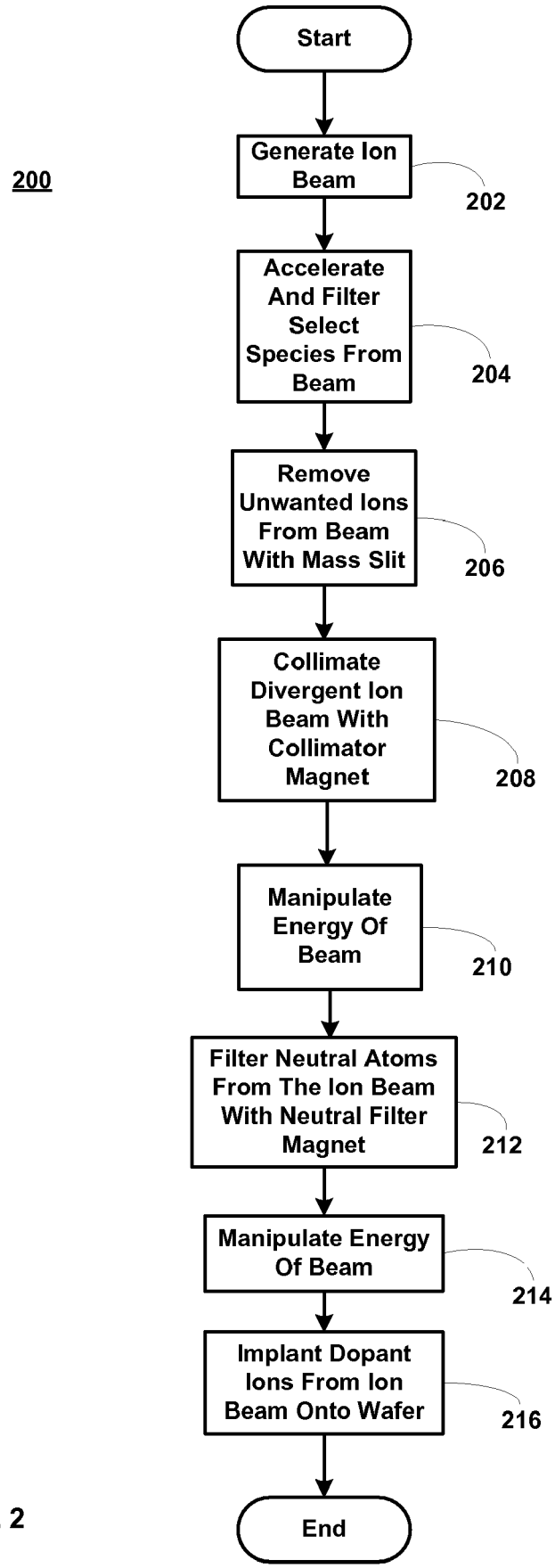
FIG. 2 shows a flow chart describing the operation of the ion implanter shown in FIGS. 1a-1b according to one embodiment of this disclosure.

FIGS. 1a-1b show a schematic top view and elevational view, respectively, of an ion implanter 100 according to one embodiment of the disclosure. For ease of illustration, FIGS. 1a-1b only show components of the ion implanter 100 that will facilitate a general understanding of the approach described in the disclosure that results in an implanter, such as a low energy, high current ion implanter, that performs with much better throughput without introducing energy contamination and/or uniformity of beam current density and implant angles. Those skilled in the art will recognize that the ion implanter 100 will have additional components not shown in FIGS. 1a-1b, especially components that are upstream of the ones shown in FIGS. 1a-1b. For example, the ion implanter would have an ion source that generates a stream of charged particles, known as an ion beam. Since the description that follows covers a low energy, high current ion implanter, the generated ion beam is an expanded beam, also known as a ribbon beam. Although this disclosure is suitable for use with a ribbon beam, it is also applicable to a scanning spot beam, also known as a pencil beam.

Other components that are not shown in FIGS. 1a-1b but would be upstream are extraction electrodes that receive the ion beam from the ion source and accelerate the positively charged ions that form the beam. An analyzer magnet, such as a 90° deflection magnet, receives the ion beam after positively charged ions have been extracted from the source and accelerates and filters unwanted species from the beam. In particular, as the ion beam enters the analyzer magnet a magnetic field directs the ion species into approximately circular paths. Heavier ions will have larger radii of curvature and strike the outer wall of the analyzer magnet; lighter ions have smaller radii of curvature and will strike the inner wall of the magnet. At the exit of the analyzer magnet a mass slit 102, shown in FIGS. 1a-1b, defines precisely the radii of curvature that limit the selection. Only ions having the selected mass-to-charge ratio will pass through the mass slit.

The ion beam emerges from the mass slit 102 as a divergent fan beam. A collimator magnet 104 receives the divergent beam and shapes the ion beam into a parallel ribbon beam. In particular, the collimator magnet 104 utilizes a shaped dipole field to bend an upper part of the diverging ion beam in a downward direction and bend a lower part of the diverging ion beam in an upper direction. The shaping performed by the collimator magnet 104 causes the ion beam to emerge as a parallel beam. In one embodiment, the collimator magnet 104 comprises a quadrupole magnet, while in others it may be a dipole with appropriate indexing or pole rotation to produce a parallel beam output.

A first deceleration stage 106 receives the ion beam after it passes through the collimator magnet 104. The first deceleration stage 106 is configured to manipulate the energy of the ion beam shaped by the collimator magnet 104. In one embodiment, the first deceleration stage 106 comprises electrostatic plates that decelerate the ion beam to an energy that permits more control of the beam. In particular, the electrostatic plates decelerate the ion beam when one of the plates is biased with a voltage potential with respect to the other plate. This creates an electric field that enables the electrostatic plates to manipulate the energy of the beam. Because the first deceleration stage 106 is receiving an ion beam having a parallel rhythm, there is no need to use a curve-shaped architecture which is commonly utilized in deceleration stages of conventional beamline ion implanters. A straight-line architecture of the first deceleration stage 106 makes it easier to have no deflections within the deceleration stage because the straight line construction guarantees that the electric fields are invariant with translation across the beam. Thus the beams will not be deflected sideways during deceleration but will merely be slowed down without changing direction. Such potential changes of direction are very deleterious to the performance of the ion implanter because they are multiplied by the refractive effect of the deceleration and thus will arrive at the wafer significantly displaced from their intended target point. Such displacements of target point, particularly if they vary across the beam, will produce non uniformities of dose and angle.

A neutral filter magnet 108 receives the decelerated ion beam from the deceleration stage 106. The neutral filter magnet 108 filters neutral atoms from the ion beam. Generally, the neutral atoms arise along the beamline as ions interact within the background gas and become neutralized. Therefore, the ion beam comprises a mixture of ions and neutral atoms. In one embodiment, the neutral filter magnet 108 comprises a dipole magnet. In operation, the neutral filter magnet 108 receives the decelerated ion beam and traps the high energy, neutral atoms within the magnet, allowing the ions with the intended energy to pass through.

A second deceleration stage 110 receives the ion beam after it passes through the neutral filter magnet 108. The second deceleration stage 110 is configured to manipulate the energy of the ion beam after filtering by the neutral filter magnet 108. In one embodiment, the second deceleration stage 110 comprises electrostatic plates that decelerate the ion beam. In particular, the electrostatic plates decelerate the ion beam when one of the plates is biased with a voltage potential with respect to the other plate. This creates an electric field that enables the electrostatic plates to manipulate the energy of the beam. This post-filter deceleration stage would only be used for processes where throughput and high beam currents were more important than energy contamination.

An endstation 112 with a wafer 114 disposed within the end station receives the ion beam after passing through the second deceleration stage 110. As the ion beam hits the wafer 114, the ions in the beam penetrate the surface of the wafer coming to rest beneath the surface to form a region of desired conductivity. For ease of illustration, FIGS. 1a-1b show only the wafer 114 within the endstation 112, however, those skilled in the art will recognize that the endstation will have additional components not shown in the figures.

With the configuration shown in FIGS. 1a-1b, the ion implanter 100 is able to perform implantations with much higher throughput without energy contamination and/or non uniformity of beam current density and implant angles. The ion implanter 100 has much higher throughput without introducing energy contamination or nonuniformity of beam current density and implant angles because the corrector magnet, which is the component within a conventional beamline ion implanter that collimates and filters the ion beam, has been separated into a separate collimator magnet and a neutral filter magnet, and a deceleration stage is placed before and after the neutral filter magnet 108. The conventional beamline ion implanter is subject to these limits because a deceleration stage is placed before and after the corrector magnet. Semiconductor manufacturers that are more concerned with throughput than with energy contamination will decelerate the ions in the ion beam at the deceleration stage located after the corrector magnet. This will preserve high current and good uniformity but will be subject to energy contamination because there will be high energy neutral atoms that will not be filtered and reach the wafer. On the other hand, if semiconductor manufacturers decelerate the ions in the ion beam at the deceleration stage located before the corrector magnet, the magnet can filter the high energy neutral atoms, but the results of the implant will suffer in throughput because the ion beam current that passes through the collimator is smaller.

By using a separate collimator magnet 104 and a neutral filter magnet 108, with a deceleration stage 106 placed before and a deceleration stage 110 located after the neutral filter magnet, the ion implanter 100 achieves higher throughput without energy contamination or non uniformity of beam current density and implant angles because the short path length through the neutral filter which does not have to collimate allows a higher beam current to pass and the rectilinear construction of the decelerate lens in the deceleration stages allows for better control of angles and also dose uniformity.

FIG. 2 shows a flow chart 200 describing the operation of the ion implanter 100 shown in FIGS. 1a-1b according to one embodiment of this disclosure. The operation of the ion implanter 100 begins at 202 when an ion source generates an ion beam. After extraction electrodes extract the beam from the source, an analyzer magnet receives the ion beam and accelerates and filters selected ion species from the beam at 204. The mass slit 102 removes unwanted ions from the ion beam at 206. The collimator magnet 104 receives the divergent beam from the mass slit 102 and shapes the ion beam into a parallel rhythm at 208. In particular, the collimator magnet 104 bends an upper part of the diverging ion beam in a downward direction and bends a lower part of the diverging ion beam in an upper direction.

The first deceleration stage 106 receives the ion beam after it passes through the collimator magnet 104 and manipulates the energy of the ion beam at 210. The neutral filter magnet 108 receives the decelerated ion beam from the deceleration stage 106 and filters neutral atoms from the ion beam at 212. In particular, the neutral filter magnet 108 receives the decelerated ion beam and traps the high energy, neutral atoms within the magnet, allowing the ions to pass through. The second deceleration stage 110 receives the ion beam after it passes through the neutral filter magnet 108 and manipulates the energy of the ion beam at 214. The wafer 114 disposed within the end station 112 receives the ion beam after passing through the second deceleration stage and is implanted with dopant ions as the beam strikes the wafer at 216.

The foregoing flow chart shows some of the processing functions associated with the ion implanter 100. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added. For example, because there are several different modes of operation, there may be blocks to denote that other actions occur during the processing of these modes. Examples of the different modes of operating the ion implanter 100 include but are not limited to having both deceleration stages 106 and 110 off ("drift mode"), having deceleration stage 106 on and deceleration stage 110 off ("extended drift mode"), having deceleration stage 106 off and deceleration stage 110 on ("process chamber decel"), or having both deceleration stage 106 and deceleration stage 110 on ("double decel").

It is apparent that there has been provided with this disclosure an approach for ion implantation with a collimator magnet and a neutral filter magnet. While the disclosure has been particularly shown and described in conjunction with a preferred embodiment thereof, it will be appreciated that variations and modifications can be effected by a person of ordinary skill in the art without departing from the scope of the disclosure.

What is claimed is:

1. An ion implanter, comprising:
 a collimator magnet configured to shape an ion beam;
 a first deceleration stage positioned downstream of the collimator magnet and configured to manipulate energy of the ion beam shaped by the collimator magnet; and
 a neutral filter magnet positioned downstream of the first deceleration stage and configured to filter neutral atoms from the ion beam emerging from the first deceleration stage.

2. The ion implanter of claim 1, wherein the collimator magnet comprises a quadrupole magnet.

3. The ion implanter of claim 1, wherein the collimator magnet comprises a dipole magnet configured to have a pole rotation that produces a parallel beam output.

4. The ion implanter of claim 1, wherein the collimator magnet comprises a shaped dipole field.

5. The ion implanter of claim 1, wherein the neutral filter magnet comprises a dipole magnet.

6. The ion implanter of claim 1, wherein the ion beam comprises a ribbon beam or a scanning spot beam.

7. The ion implanter of claim 1, further comprising a second deceleration stage configured to manipulate the energy of the ion beam filtered by the neutral filter magnet.

8. A method of ion implantation, comprising:
 generating an ion beam;
 shaping the ion beam into a parallel ribbon beam at a first position;
 manipulating energy of the shaped parallel ion beam at a second position downstream of the first position; and
 filtering neutral atoms from the parallel ion beam at a third position downstream of the second position.

9. The method of claim 8, wherein the shaping of the ion beam into the parallel ribbon beam comprises using a collimator magnet.

10. The method of claim 8, wherein the shaping of the ion beam into the parallel ribbon beam comprises receiving the ion beam with a diverging fan beam, bending an upper part of the diverging ion beam in a downward direction and bending a lower part of the diverging ion beam in an upper direction.

11. The method of claim 8, wherein the manipulating of energy comprises using a deceleration stage.

12. The method of claim 8, wherein the filtering of neutral atoms from the ion beam comprises using a neutral filter magnet.

13. The method of claim 9, further comprising manipulating the energy of the filtered ion beam.

14. The method of claim 13, wherein the manipulating of energy of the filtered ion beam comprises using a deceleration stage.

* * * * *